United States Patent
Kim et al.

(10) Patent No.: US 9,059,398 B2
(45) Date of Patent: Jun. 16, 2015

(54) METHODS FOR ETCHING MATERIALS USED IN MRAM APPLICATIONS

(71) Applicant: Applied Materials, Inc., Santa Clara, CA (US)

(72) Inventors: Jisoo Kim, Pleasanton, CA (US); Mang-Mang Ling, Sunnyvale, CA (US); Khoi Doan, San Jose, CA (US); Chi Hong Ching, Santa Clara, CA (US); Srinivas D. Nemani, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 16 days.

(21) Appl. No.: 13/750,892

(22) Filed: Jan. 25, 2013

(65) Prior Publication Data

US 2014/0038311 A1 Feb. 6, 2014

Related U.S. Application Data (60) Provisional application No. 61/679,651, filed on Aug. 3, 2012.

(51) Int. Cl.
  *H01L 43/12* (2006.01)
  *H01L 43/08* (2006.01)
  *H01L 27/22* (2006.01)
  *G11C 11/16* (2006.01)

(52) U.S. Cl.
  CPC .............. *H01L 43/12* (2013.01); *H01L 27/222* (2013.01); *H01L 43/08* (2013.01); *G11C 11/16* (2013.01)

(58) Field of Classification Search
  CPC ....... H01L 43/08; H01L 43/12; H01L 27/222; H01L 21/266; G11C 11/16
  USPC .................................... 438/3; 257/E27.005
  See application file for complete search history.

(56) References Cited

U.S. PATENT DOCUMENTS

| 5,476,800 | A  | * | 12/1995 | Burton et al. | 438/506 |
| 6,023,395 | A  | * | 2/2000  | Dill et al. | 360/324.2 |
| 7,683,447 | B2 |   | 3/2010  | Wang et al. | |
| 2004/0229430 | A1 | * | 11/2004 | Findeis et al. | 438/257 |
| 2008/0224255 | A1 | * | 9/2008  | Kim et al. | 257/506 |
| 2010/0112794 | A1 | * | 5/2010  | Scotney-Castle et al. | 438/513 |
| 2012/0135273 | A1 |   | 5/2012  | Horng et al. | |

(Continued)

OTHER PUBLICATIONS

Mayank Chakraverty, et al, "Advanced Simulations of an MTJ based Magnetoresistive Random Access Memory (MRAM) Cell for Low Power Cell Phone Applications", IEEE 2011.

*Primary Examiner* — Su C Kim
*Assistant Examiner* — Regan J Rundio
(74) *Attorney, Agent, or Firm* — Patterson & Sheridan, LLP (57) ABSTRACT

Embodiments of the invention provide methods and apparatus for fabricating magnetic tunnel junction (MTJ) structures on a substrate in magnetoresistive random access memory applications. In one embodiment, a method of forming a MTJ structure on a substrate includes providing a substrate having a insulating tunneling layer disposed between a first and a second ferromagnetic layer disposed on the substrate, wherein the first ferromagnetic layer is disposed on the substrate followed by the insulating tunneling layer and the second ferromagnetic layer sequentially, supplying an ion implantation gas mixture to implant ions into the first ferromagnetic layer exposed by openings defined by the second ferromagnetic layer, and etching the implanted first ferromagnetic layer.

33 Claims, 4 Drawing Sheets

(56) References Cited

U.S. PATENT DOCUMENTS

2012/0135543 A1    5/2012   Shin et al.
2012/0187510 A1*   7/2012   Jung et al. .................... 257/421
2012/0276657 A1*  11/2012   Joubert et al. ................. 438/3
2013/0084653 A1*   4/2013   Rubin et al. ................... 438/3

* cited by examiner

METHODS FOR ETCHING MATERIALS USED IN MRAM APPLICATIONS

RELATED APPLICATIONS

This application claims priority to U.S. Patent Application Ser. No. 61/679,651 filed on Aug. 3, 2012, which is incorporated by reference in its entirety.

FIELD

Embodiments of the invention relate to methods for fabricating structures used in magnetoresistive random access memory (MRAM) applications. More specifically, embodiments of the invention relate to methods for fabricating magnetic tunnel junction structures for MRAM applications.

BACKGROUND

Magnetoresistive random access memory (MRAM) is a type of memory device containing an array of MRAM cells that store data using their resistance values instead of electronic charges. Generally, each MRAM cell includes a magnetic tunnel junction (MTJ) structure. The MTJ structure may have adjustable resistance to represent a logic state "0" or "1." The MTJ structure typically includes a stack of magnetic layers having a configuration in which two ferromagnetic layers are separated by a thin non-magnetic dielectric, e.g., an insulating tunneling layer. A top and a bottom electrode are utilized to sandwich the MTJ structure so electric current may flow between the top and the bottom electrode.

One ferromagnetic layer, e.g., a reference layer, is characterized by a magnetization with a fixed direction. The other ferromagnetic layer, e.g., a storage layer, is characterized by a magnetization with a direction that is varied upon writing of the device, such as by applying a magnetic field. When the respective magnetizations of the reference layer and the storage layer are antiparallel, a resistance of the magnetic tunnel junction is high having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

A MRAM device is conventionally manufactured by photolithography, in which silicon oxide and tin nitride is used as a mask patterning the stack of magnetic layers including the ferromagnetic layers and the insulating tunneling layer. The hard mask layers disposed on the stack of magnetic layers are patterned to form an array of dots. Portions of the stack of magnetic layers exposed by the array of dots are then etched away to form a corresponding array of MRAM cells. Subsequently, the hard mask layers stripped to result in a MRAM device.

As the size of MRAM cells decreases, conventional etching process as performed to pattern the stack of magnetic layers become problematic. For example, conventional etching processes often generate solid etching by-products which may redeposit onto the sidewall of the MTJ structure during the patterning process. As the size of MRAM cells decrease, redepositing of the etching by-products may create undesired etching profile, e.g., sloped, slant or tapered sidewall or early close-up of the features as etched, thereby leading to critical dimension inaccurate and circuit shorting. Furthermore, etching by-product built-up may also result in incomplete etching of the MTJ structures, thereby resulting is connected pitch patterns at the bottom of the MTJ structures, eventually leading to device failure.

Therefore, there is a need in the art for improved methods and apparatus for fabricating MTJ structures for MRAM applications.

SUMMARY

Embodiments of the invention provide methods and apparatus for fabricating magnetic tunnel junction (MTJ) structures on a substrate in MRAM application. In one embodiment, a method of forming a magnetic tunnel junction (MTJ) structure on a substrate includes placing a substrate having a insulating tunneling layer disposed between a first and a second ferromagnetic layer disposed on the substrate in a processing chamber, wherein the first ferromagnetic layer is disposed on the substrate followed by the insulating tunneling layer and the second ferromagnetic layer sequentially, supplying an ion implantation gas mixture to implant ions into the first ferromagnetic layer exposed by openings defined by the second ferromagnetic layer, and etching the implanted first ferromagnetic layer.

In another embodiment, a method of forming a magnetic tunnel junction (MTJ) structure on a substrate includes placing a substrate having a insulating tunneling layer disposed between a first and a second ferromagnetic layer disposed on the substrate in a processing chamber, wherein the first ferromagnetic layer is disposed on the substrate followed by the insulating tunneling layer and the second ferromagnetic layer sequentially, and etching the insulating tunneling layer through openings defined by the second ferromagnetic layer by supplying gas mixture including at least a hydrocarbon gas and a nitrogen containing gas into the processing chamber.

In yet another embodiment, a method of forming a magnetic tunnel junction (MTJ) structure on a substrate includes providing a substrate having a insulating tunneling layer disposed between a first and a second ferromagnetic layer disposed on the substrate, wherein the first ferromagnetic layer is disposed on the substrate followed by the insulating tunneling layer and the second ferromagnetic layer sequentially, supplying an ion implantation gas mixture to implant ions into the first ferromagnetic layer exposed by openings defined by the second ferromagnetic layer and the insulating tunneling layer, and etching the implanted first ferromagnetic layer by a gas mixture including at least a hydrocarbon and nitrogen containing gas.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings.

To facilitate understanding, identical reference numerals have been used, where possible, to designate identical elements that are common to the figures. It is contemplated that elements disclosed in one embodiment may be beneficially utilized on other embodiments without specific recitation.

It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide apparatus and methods of forming MTJ structures on a substrate for MRAM applications. The apparatus and methods include modifying the film properties of a material layer used in MTJ structures by applying a plasma immersion ion implantation process to implant ions into the material layer in a patterned manner. The implanted ions in the material layer modify the film properties of the material layer which then become more easily removed from the substrate during subsequent etching or patterning processes. Embodiments of the invention include modifying film properties of a material layer used in MTJ structures and subsequently etching the modified material layer to form MTJ structures with desired dimension and features for MRAM applications.

Figure 1:
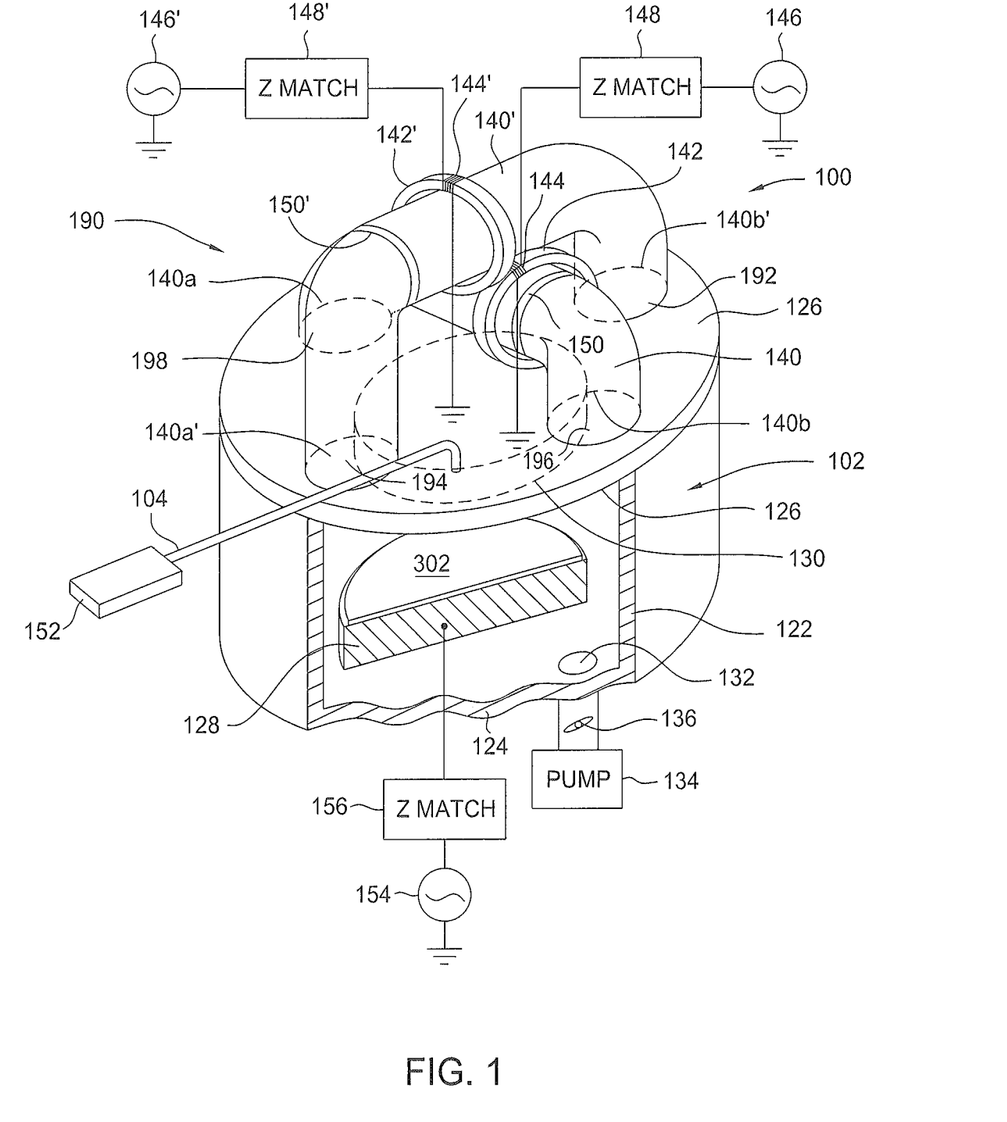
FIG. 1 depicts one embodiment of a plasma immersion ion implantation tool suitable for practice one embodiment of the present invention.

FIG. 1 is an isometric view of a plasma immersion ion implantation chamber that may be utilized to practice embodiments of the present invention. The chamber of FIG. 1 is useful for performing plasma immersion ion implantation procedures and an etching process, but may also be used to shower a substrate with energetic ions without implanting or to gently treat to the substrate surface. The processing chamber 100 includes a chamber body 102 having a bottom 124, a top 126, and side walls 122 enclosing a process region 104. A substrate support assembly 128 is supported from the bottom 124 of the chamber body 102 and is adapted to receive a substrate 302 for processing. In one embodiment, the substrate support assembly 128 may include an embedded heater element or cooling element (not shown) suitable for controlling the temperature of the substrate 302 supported on the substrate support assembly 128. In one embodiment, the temperature of the substrate support assembly 128 may be controlled to prevent the substrate 302 from over heating during the plasma immersion ion implantation process and/or the etching process so as to maintain the substrate 302 at a substantially constant temperature during the plasma immersion ion implantation process. The temperature of the substrate support assembly 128 may be controlled between about 10 degrees Celsius to about 200 degrees Celsius.

A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A process gas source 152 is coupled to the gas distribution plate 130 to supply gaseous precursor compounds for processes performed on the substrate 302.

The chamber 100 depicted in FIG. 1 further includes a plasma source 190. The plasma source 190 includes a pair of separate external reentrant conduits 140, 140' mounted on the outside of the top 126 of the chamber body 102 disposed transverse or orthogonal to one another. The first external conduit 140 has a first end 140a coupled to an opening 198 formed in the top 126 and is in communication with a first side of the process region 104 in the chamber body 102. A second end 140b has an opening 196 coupled to the top 126 and is in communication with a second side of the process region 104. The second external reentrant conduit 140b has a first end 140a' having an opening 194 coupled to the top 126 and in communication with a third side of the process region 104. A second end 140b' having an opening 192 of the second external reentrant conduit 140b is coupled to the top 126 and is in communication with a fourth side of the process region 104. In one embodiment, the first and second external reentrant conduits 140, 140' are configured to be orthogonal to one another, thereby providing the two ends 140a, 140a', 140b, 140b' of each external reentrant conduits 140, 140' orientated at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may have other configurations utilized to control plasma distribution in the process region 104.

Magnetically permeable torroidal cores 142, 142' surround a portion of a corresponding one of the external reentrant conduits 140, 140'. The conductive coils 144, 144' are coupled to respective RF power sources 146, 146' through respective impedance match circuits or elements 148, 148'. Each external reentrant conduits 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF bias generator 154 coupled to the substrate support assembly 128 through an impedance match circuit or element 156.

Process gases including gaseous compounds supplied from the process gas source 152 are introduced through the overhead gas distribution plate 130 into the process region 104. RF power source 146 is coupled from the power applicators, i.e., core and coil, 142, 144 to gases supplied in the conduit 140, which creates a circulating plasma current in a first closed torroidal path power source 146' may be coupled from the other power applicators, i.e., core and coil, 142', 144' to gases in the second conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF power sources 146, 146', which may be the same or slightly offset from one another.

In operation, a process gas mixture is provided to the chamber from the process gas source 152. Depending on the embodiment, the process gas mixture may comprise inert or reactive gases to be ionized and directed toward the substrate 302. Virtually any gas that may be easily ionized can be used in the chamber 100 to practice embodiments of the invention. Some inert gases that may be used include helium, argon, neon, krypton, and xenon. Reactive or reactable gases that may be used include borane and its oligomers, such as diborane, phosphine and its oligomers, arsine, nitrogen containing gases, halogen containing gas, hydrogen containing gases, oxygen containing gases, carbon containing gases, and combinations thereof. In some embodiments, nitrogen gas, hydrogen gas, oxygen gas, and combinations thereof may be used. In other embodiments, ammonia and its derivatives, analogues, and homologues, may be used, or hydrocarbons such as methane or ethane may be used. In still other embodiments, halogen containing gases, such as fluorine or chlorine containing gases like $BF_3$, $PF_3$, may be used. Any substance that may be readily vaporized, and that does not deposit a material substantially identical to the magnetically susceptible layer of the substrate, may be used to modify its magnetic properties through bombardment or plasma immersion ion implantation. Most hydrides may be used, such as silane, borane, phosphine, $PF_3$, diborane ($B_2H_6$), methane ($CH_4$), and other hydrides. Also, carbon dioxide and carbon monoxide may be used.

The power of each RF power source 146, 146' is operated so that their combined effect efficiently dissociates the process gases supplied from the process gas source 152 and produces a desired ion flux at the surface of the substrate 302. The power of the RF bias generator 154 is controlled at a selected level at which the ion energy dissociated from the process gases may be accelerated toward the substrate surface and implanted at a desired depth below the top surface of the substrate 302 in a desired ion concentration. For example, with relatively low RF power of about 100 W would give ion energy of about 200 eV. Dissociated ions with low ion energy may be implanted at a shallow depth between about 1 Å and about 500 Å from the substrate surface. Alternatively, high bias power of about 5000 W would give ion energy of about 6 keV. The dissociated ions with high ion energy provided and generated from high RF bias power, such as higher than about 100 eV, may be implanted into the substrate having a depth substantially over 500 Å depth from the substrate surface. In one embodiment, the bias RF power supplied to the chamber may be between about 100 watts and about 7000 watts, which equates to an ion energy between about 100 eV and about 7 keV.

Whereas disrupting the alignment of atomic spins in selected portions of the magnetic layer is desired, ion implant with relatively high energy, such as between about 200 eV and about 5 keV, or between about 500 eV and about 4.8 keV, such as between about 2 keV and about 4 keV, for example about 3.5 keV, may be useful. The combination of the controlled RF plasma source power and RF plasma bias power dissociates electrons and ions in the gas mixture, imparts a desired momentum to the ions, and generates a desired ion distribution in the processing chamber 100. The ions are biased and driven toward the substrate surface, thereby implanting ions into the substrate in a desired ion concentration, distribution and depth from the substrate surface. In some embodiments, ions may be implanted at a concentration between about $10^{18}$ atoms/cm$^3$ and about $10^{23}$ atoms/cm$^3$ at a depth ranging from about 1 nm to about 100 nm, depending on the thickness of the magnetic layer.

Plasma immersion implanting ions deep in the magnetic layer causes the most change in the magnetic/film properties of the implanted area. A shallow implant, such as 2-10 nm in a 100 nm thick layer, will leave a significant portion of the layer below the implanted area with atomic spin in alignment. Such a shallow implant with ions having energy between about 200 eV and about 1,000 eV will cause a partial change to the magnetic/film properties. Thus, the degree of change may be selected by tuning the depth of the implant. The size of ion being implanted will also affect the energy needed to implant ions to a given depth. For example, helium ions implanted into a magnetic material at an average energy of about 200 eV will demagnetize and/or change film properties of the magnetic material by about 20% to about 50%, and argon ions implanted at an average energy of about 1,000 eV will demagnetize and/or change film properties the magnetic material by about 50% to about 80%.

It is noted that the ions provided in a plasma immersion ion implantation process, as described herein, are generated from a plasma formed by applying a high voltage RF or any other forms of EM field (microwave or DC) to a processing chamber. The plasma dissociated ions are then biased toward the substrate surface and implanted into a certain desired depth from the substrate surface. In one embodiment an etching process is desired to be performed to remove a portion of the material layers from the substrate, and an etchant may be used to form plasma to react and etch the material layers from the substrate surface, thereby removing the material layers from the substrate as needed.

It is noted that the conventional ion implantation processing chamber utilizing ion guns or ion beams accelerates a majority of ions up to a certain energy resulting in implanting accelerated ions into a certain deeper region of the substrate, as compared to the ions implanted by the plasma immersion ion implantation process. The ions provided in the plasma immersion ion implantation process do not generally have a beam-like energy distribution as the ions in conventional beamliners. Due to several factors, such as ion collisions, process time and process space and varying intensity of accelerating plasma field, a significant fraction of plasma ions have an energy spread down close to zero ion energy. Accordingly, the ion concentration profile formed in the substrate by a plasma immersion ion implantation process is different from the ion concentration profile formed in the substrate by a conventional ion implantation processing chamber, wherein the ions implanted by the plasma immersion ion implantation process are mostly distributed close to the surface of the substrate while the ions implanted by the conventional ion implantation processing chamber. Furthermore, the energy required to perform a plasma immersion ion implantation process is less than the energy required to operate an ion gun (or an ion beam) ion implantation process. The higher energy required from the conventional ion gun (or an ion beam) ion implantation process can provide ions with higher implantation energy to penetrate into a deeper region from the substrate surface. In contrast, the plasma immersion ion implantation process utilizing RF power to plasma dissociate ions for implanting requires less energy to initiate the plasma immersion ion implantation process so that the ions generated from the plasma can be efficiently controlled and implanted into a relatively shadow depth from the substrate surface. Accordingly, the plasma immersion ion implantation process provides an economical efficient ion implantation process and etching process, as compared to the conventional ion gun/beam ion implantation process, to implant ions into a substrate surface at desired depth or remove portion of material layers from the substrate surface with less energy and manufacturing costs.

Figure 2:
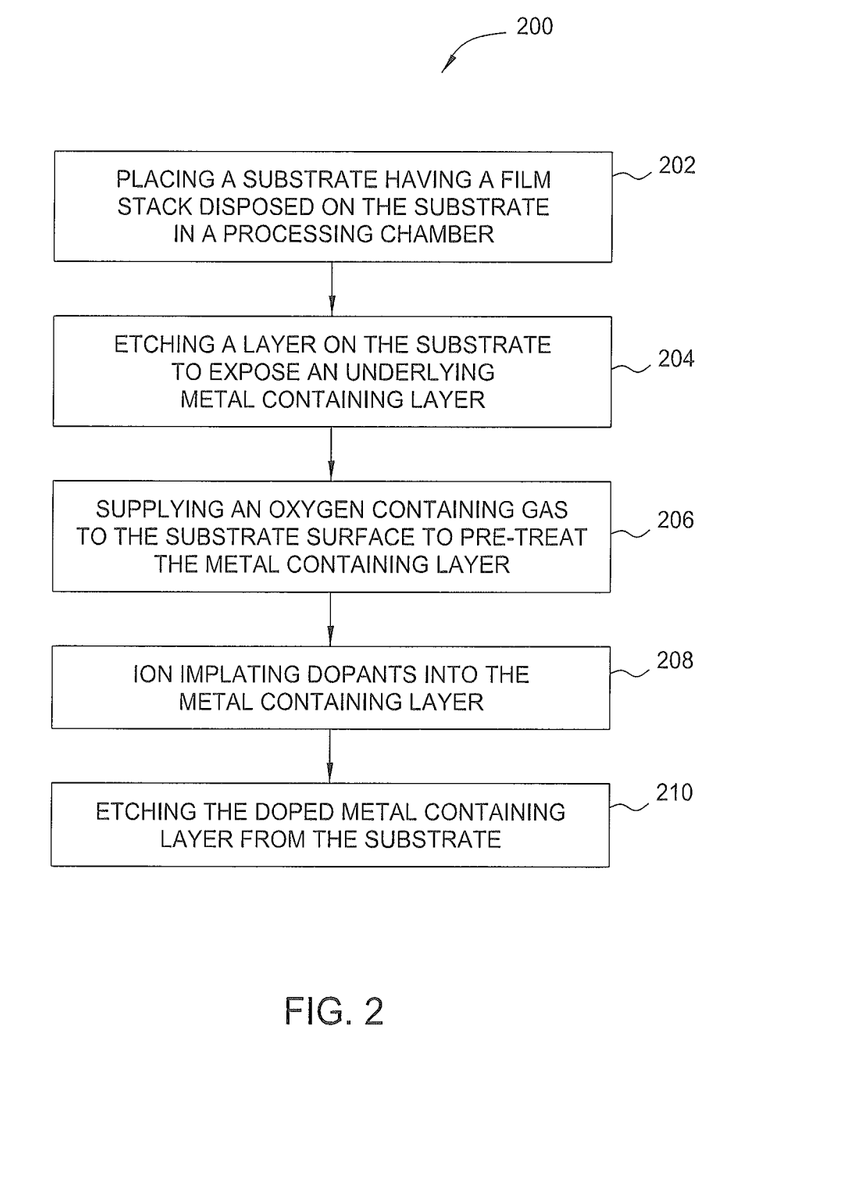
FIG. 2 depicts a flow diagram illustrating a method for fabricating magnetic tunnel junction (MTJ) structures utilizing a plasma immersion ion implantation process according to one embodiment of the present invention.

FIG. 2 depicts a flow diagram illustrating a process 200 for manufacturing MTJ structures on a substrate, such as the substrate 302 depicted in FIG. 1, for MRAM applications according to one embodiment of the present invention. FIGS. 3A-3E are schematic cross-sectional views of the substrate 302 at various stages of the process of FIG. 2. The process 200 is configured to be performed in a plasma immersion ion implantation processing chamber, such as the processing chamber 100 as described in FIG. 1. It is contemplated that the process 200 may be performed in other suitable plasma immersion ion implantation systems or etching chamber, including those from other manufacturers.

Figure 3A:
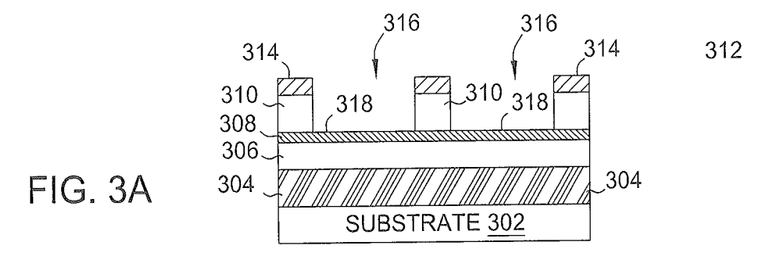
FIGS. 3A-3E are schematic side views of a substrate at various stages of the method of FIG. 2.

The process 200 begins at block 202 by placing a substrate, such as the substrate 302, in the processing chamber 100. In one embodiment, the substrate 302 comprises metal or glass, silicon, dielectric bulk material and metal alloys or composite glass, such as glass/ceramic blends, as shown in FIG. 3A. In one embodiment, the substrate 302 includes a first electrode 304 disposed on the substrate 302. Subsequently, a MTJ structure 312 is formed on the first electrode 304 followed by a second electrode layer 314 disposed on the MTJ structure 312. The MTJ structure 312 includes a first and a second ferromagnetic layer 306, 310 separated by an insulating tunneling layer 308. The second electrode layer 314 is then formed on the MTJ structure 312. In one embodiment, the first and the second electrode layer 304, 314 may be fabricated from metal containing materials, such as tungsten, ruthenium (Ru), tantalum (Ta), titanium (Ti), copper, aluminum, TiN, TaN, or doped silicon layers. The insulating tunneling layer 308 may be fabricated from a dielectric layer, such as $Al_2O_3$, MgO, $TaO_x$, HfO, or other suitable materials. The first and the second ferromagnetic layer 306, 310 may be fabricated by a metal alloy, such as a nickel containing material, Ru containing material, a cobalt containing material, and palladium containing materials. Suitable examples of the first and the second ferromagnetic layer 306, 310 include Ru containing layer, $NiFeO_x$, NiFe, $CoFeO_x$, CoFeB, CoFe, $NiO_x$, $CoO_x$, $FeO_x$, CoPt, CoPd, $TaO_x$ and the like. In the embodiment depicted in FIG. 3A, the first ferromagnetic layer 306 may be a Ru and/or CoPt or CoPd containing layer and the second ferromagnetic layer 310 is a CoPt or a CoPd layer, CoFeB, Ru, $TaO_x$ and Ti containing layer. The insulating tunneling layer 308 is a MgO layer. The first and the second electrode layer 304, 314 are tungsten containing layers. The first and the second ferromagnetic layer 306, 310 and the insulating tunneling layer 308 formed in the MTJ structure may be formed by any suitable method, such as physical vapor deposition, or sputtering, chemical vapor deposition, plasma-enhanced chemical vapor deposition, spin-coating, plating by electrochemical or electroless means, and the like. In one embodiment, the first ferromagnetic layer 306 may have a thickness between about 20 nm and about 40 nm, such as between about 25 nm and 35 nm. The second ferromagnetic layer 310 may have a thickness between about 10 nm and about 15 nm, such as about 12 nm. The insulating tunneling layer 308 may have a thickness between about 0.5 nm and about 1.5 nm, such as about 1 nm.

In the embodiment depicted in FIG. 3A, the second electrode layer 314 and the second ferromagnetic layer 310 have been patterned to form openings 316 therein, exposing a surface 318 of the insulating tunneling layer 308 for etching. The patterned second electrode layer 314 and the patterned second ferromagnetic layer 310 serve as a mask layer masking portions of the insulating tunneling layer from etching during subsequent processes. Thus, the features formed in the second electrode layer 314 and the second ferromagnetic layer 310 can then be transferred into the underlying insulating tunneling layer 308 and/or the first ferromagnetic layer 306 and/or the first electrode 304 during subsequent etching processes. Additionally, a hard mask layer (not shown) may also be utilized as a mask layer during etching to assist maintaining good profile transfer to the magnetic tunnel junction MTJ structure 312.

Figure 3B:
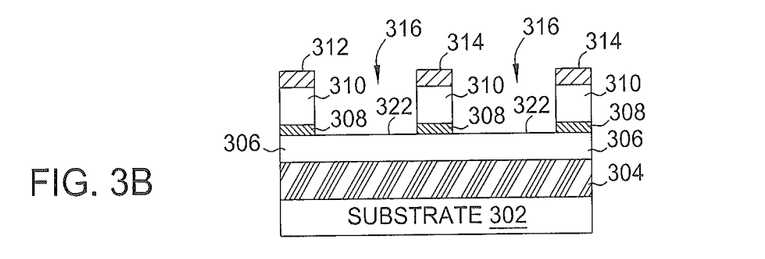

At block 204, an etching process is performed to remove the insulating tunneling layer 308 exposed by the patterned second electrode layer 314 and the second ferromagnetic layer 310, until the underlying a surface 320 of the first ferromagnetic layer 306 is exposed, as shown in FIG. 3B.

During etching, an etching gas mixture is supplied into the substrate surface to remove the insulating tunneling layer 308 exposed by the patterned second electrode layer 314 and the second ferromagnetic layer 310 from the substrate 302. In one embodiment, the etching gas mixture may include a hydrocarbon gas and a nitrogen containing gas. It is believed that the nitrogen containing gas supplied in the gas mixture may also assist reacting with the insulating tunneling layer 308, thereby forming the resultant etched tunneling layer 308 with cleaned sidewall and desired profile. Furthermore, hydrocarbon gas supplied in the gas mixture may assist reacting with the oxygen elements in the insulating tunneling layer 308, forming volatile by-product pumping out of the processing chamber. The hydrocarbon gas in the gas mixture may form volatile metalorganic species, such as metal methylated compounds, or metal carbonyls, which may readily be pumped out of the chamber. Unlike the conventional process using BCl3 or HBr, the side product thereof are often too corrosive or non-volatile, which may adversely adhere on the substrate surface of chamber cornpoemtn, thereby resulinig undesired contanimant and residuals.

In one embodiment, suitable examples for the hydrocarbon include $CH_4$, $C_2H_4$, $C_3H_8$, $C_2H_6$ and other suitable hydrocarbon compounds. Suitable examples for the nitrogen containing gas includes $NH_3$, $N_2$, $NF_3$, $N_2O$, $NO_2$, NO and the like. Other suitable carrier or reacting gas may also be supplied in the gas mixture. Suitable examples of the carrying or reacting gas include $N_2$, $H_2$, $O_2$, and the like. In another embodiment, an inert gas may also be supplied into the etching gas mixture to assist the profile control as needed. Examples of the inert gas supplied in the gas mixture include Ar, He, Ne, Kr, Xe or the like.

In one embodiment, the hydrocarbon compounds and the nitrogen containing gas supplied in the etching gas mixture may be maintained at a predetermined ratio to yield an efficient etching rate while efficiently maintaining desired sidewall profile. In an exemplary embodiment, the hydrocarbon compounds and the nitrogen containing gas are supplied in the etching gas mixture at a ratio between about 5:1 and about 1:0.5, such as 1:1. Alternatively, hydrocarbon compounds may be supplied at a flow rate by volume between about 10 sccm and about 100 sccm, such as about 50 sccm. The nitrogen containing gas may be supplied at a flow rate by volume between about 20 sccm and about 120 sccm, such as about 50 sccm. $N_2$ gas may be supplied at a flow rate by volume between about 5 sccm and about 120 sccm, such as about 10 sccm. The $H_2$ gas may be supplied at a flow rate by volume between about 90 sccm and about 180 sccm, such as about 90 sccm. RF power is supplied to form a plasma from the gas mixture. The RF source power may be supplied to energize at the gas mixture between about 1000 watts and about 2000 watts, such as about 1200 watts, and at a frequency between about 400 kHz and about 13.56 MHz. A bias power may also be supplied as needed. The bias power may be supplied at between about 300 watts and about 800 watts, such as about 500 watts.

Several process parameters may also be controlled while supplying the etching gas mixture to perform the etching process. The pressure of the processing chamber may be controlled at between about 0.5 milliTorr and about 500 milliTorr, such as between about 1 milliTorr and about 20 milliTorr, such as about 15 milliTorr.

The end point of the etching process at block 204 may be controlled by a timed mode or other suitable methods. For example, the etching process may be terminated after performing between about 200 seconds and about 600 seconds until the first ferromagnetic layer 306 is exposed, as shown in FIG. 3B. The etching process may be terminated by determination from an endpoint detector, such as an OES detector or other suitable detector as needed.

Figure 3C:
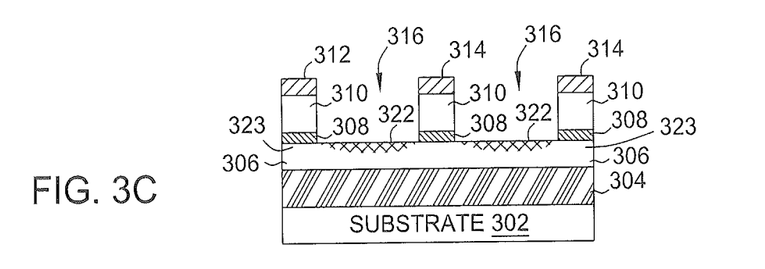

At block 206, after the insulating tunneling layer etching process, an oxygen containing pretreatment process is performed. The oxygen containing pretreatment process treats the first ferromagnetic layer 306 to alter the surface properties, thereby converting the surface 320 of the first ferromagnetic layer 306 into an oxygen-rich area 321. The oxygen pretreatment process may efficiently incorporate oxygen elements into the first ferromagnetic layer 306, altering the film surface properties into an oxygen-rich ferromagnetic layer. As the patterned second electrode layer 314, the patterned second ferromagnetic layer 310 and the insulating tunneling layer 308 protect masked portions 323 of the first ferromagnetic layer 306 from being processed by the oxygen containing plasma, the surface properties of the masked portion 323 as protected would not be altered by the pretreatment process, thereby maintaining its original film properties. The exposed surface 320 of the first ferromagnetic layer 306 is subject to plasma energy which alters its film properties so as to assist removal of the first ferromagnetic layer 306 from the substrate 302 during subsequent fabricating processes. Furthermore, the pretreatment process may also be performed to modify the morphology and/or surface roughness of the surface of the first ferromagnetic layer 306 to facilitate implantation or penetration of ions or dopants into the first ferromagnetic layer 306.

In one embodiment, the pretreatment process may be performed by supplying a gas mixture including a oxygen containing gas to the substrate surface. The oxygen containing gas may be selected from the group consisting of $O_2$, $H_2O$, $O_3$, $N_2O$, combinations thereof and the like. In one exemplary embodiment, the oxygen containing gas used to perform the substrate treatment process includes $O_2$ gas. In certain embodiments, an inert gas may be used to perform the pretreatment process. Examples of the inert gas include Ar, He or the like. It is noted that the process parameters used to perform the pretreatment process by using the oxygen containing gas may be configured to be similar with the process parameters for using the inert gas.

During the plasma pretreatment process, the substrate temperature is controlled less than about 100 degrees Celsius, such as between about 5 degrees Celsius and about 60 degrees Celsius, for example between about 10 degrees Celsius and about 50 degrees Celsius, like about 25 degrees Celsius. $O_2$ gas supplied for the pretreatment process may be controlled at a flow rate between about 50 sccm and about 150 sccm, such as about 100 sccm. The RF power supplied to perform the treatment process may be controlled at between about 2000 milliwatts and about 4000 milliwatts, such as about 3000 milliwatts. The process pressure may be controlled at between about 10 milliTorr and about 20 milliTorr. The process time may be controlled at a range between about 10 seconds and about 20 seconds, such as about 15 seconds.

Figure 3D:
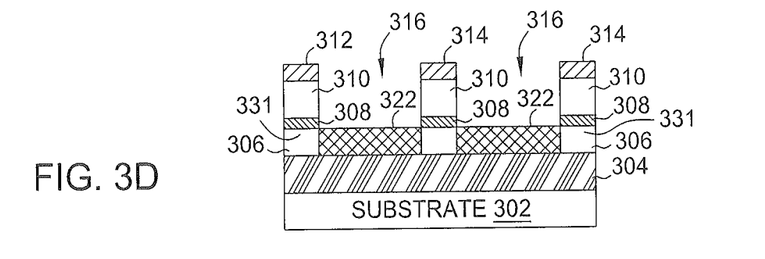

At block 208, a plasma immersion ion implantation process is performed to implant ions through the oxygen-rich area 321 of the first ferromagnetic layer 306 unprotected/unmasked by the patterned second electrode layer 314, second ferromagnetic layer 310 and the insulating tunneling layer 308, as shown in FIG. 3D. The plasma immersion ion implantation process may be performed to implant ions into the treated oxygen-rich area 321 of the first ferromagnetic layer 306 to modify the film properties, thereby converting the first ferromagnetic layer 306 into a doped ferromagnetic layer 330, as shown in FIG. 3D. The ion implantation process may be performed in an ion implantation processing chamber, such as the processing chamber 100 depicted in FIG. 1. The ions dissociated in the processing chamber are directed toward the substrate, and impinge on the exposed surface 320 of the first ferromagnetic layer 306 defined by the openings 316 of the patterned second electrode layer 314, second ferromagnetic layer 310 and the insulating tunneling layer 308. The dissociated ions will generally begin to disrupt and change the film properties when the plasma energy and the dissociated ions reach sufficient intensity to stimulate thermal motion of the atoms in the first ferromagnetic layer 306. The ions implanted into the first ferromagnetic layer 306 will substantially change the bonding structures and/or the bonding energy of the first ferromagnetic layer 306, thereby assisting the doped first ferromagnetic layer 306 to react with the etchant subsequently supplied thereto so as to remove the first ferromagnetic layer 306 from the substrate 302. The ion implantation process modifies the surface properties of the first ferromagnetic layer 306, creating the modified zones 330 (unprotected by the patterned layers 314, 310, 308) and leaving unmodified zones 331 (protected by the patterned layers 314, 310, 308) on the substrate 302 with desired properties. Accordingly, by choosing a proper range of plasma energy to implant suitable ion species into the desired portion 322 of first ferromagnetic layer 306 alters the film properties thereof so as to assist removing the first ferromagnetic layer 306 from the substrate surface.

As discussed above, the dopants/ions impinging into the exposed first ferromagnetic layer 306 unprotected by the layers 314, 310, 308 may change the film properties of the exposed first ferromagnetic layer 306. For example, implanted ions, such as boron, phosphorus, and arsenic ions, will not only insert ions near the implant sites, but also impart their own film properties to the surface, resulting in changed film properties for the implanted region 330. Furthermore, the thermal energy or other types of energy provided during the ion impinging or plasma bombardment process may transfer kinetic energy of the energetic ions to the exposed first ferromagnetic layer 306, thereby activating the atoms in the exposed first ferromagnetic layer 306 into an excited state ready to react with the etchant subsequently supplied thereto.

In one embodiment, suitable examples of the implantation gas mixture include $PF_3$, $BH_3$, $B_2H_6$, $P_2H_5$, $PH_3$, $BF_3$, $BCl_3$, $P_2O_5$, $SF_6$ and the like. In one particular embodiment, the implantation gas mixture includes $PF_3$ gas and the first ferromagnetic layer 306 is a CoPt or CoPd layer. It is believed that the phosphorous elements, e.g., P ions, supplied in the gas mixture during the plasma immersion ion implantation process may efficiently react with the Co elements and the Pt or Pd elements in the first ferromagnetic layer 306, forming a complex compound that may be easily attacked so as to react with the etchants subsequently supplied thereto to facilitate removal of the first ferromagnetic layer 306 from the substrate. The $PF_3$ gas is dissociated by the RF energy supplied into the processing chamber, forming fluorine active species and phosphorous active species. It is believed that the fluorine active species will slightly etch the surface of the first ferromagnetic layer 306 unprotected by the patterned layers 314, 310, 308 while incorporating the phosphorous species into the first ferromagnetic layer 306 to modify the film properties thereof. The implanted phosphorous elements may alter atom arrangement and distribution formed in the unmasked region 331 of the first ferromagnetic layer 306, converting the first ferromagnetic layer 306 to have film properties that may be easily attacked and removed by the etchant subsequently supplied to the substrate during the subsequent processing steps.

In one embodiment, the ions dissociated from the gas mixture may be implanted into the first ferromagnetic layer 306 to a depth of at least about 10 percent % to about 40 percent % of the overall thickness of the first ferromagnetic layer 306. In one embodiment, the ions are implanted to a depth of between about 0.5 nm and about 2 nm from the substrate surface.

In one embodiment, the gas mixture supplied during the ion implantation process at step 208 may further include an inert gas as needed. Suitable examples of the inert gas include $N_2$, Ar, He Xe, Kr and the like. The inert gas may promote the ion bombardment in the gas mixture, thereby increasing the probability of process gas collision, thereby resulting in reduced recombination of ion species.

RF power, such as capacitive or inductive RF power, DC power, electromagnetic energy, or magnetron sputtering, may be supplied into the processing chamber 100 to assist dissociating the gas mixture during processing. Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion.

In one embodiment, the ion implanting gas mixture, such as $PH_3$, may be supplied into the processing chamber at a flow rate between about 30 sccm and about 50 sccm, such as about 40 sccm. The chamber pressure is generally maintained between about 5 mTorr and about 10 mTorr, such as about 8 mTorr.

Ions, such as helium, hydrogen, oxygen, nitrogen, boron, phosphorus, arsenic, fluorine, silicon, platinum, aluminum, or argon, utilized to alter the film properties of the first ferromagnetic layer 306 may be generated during the plasma dissociation process during the RF power generation process. The electric field provided by the RF power may be capacitively or inductively coupled for purposes of ionizing the atoms, and may be a DC discharge field or an alternating field, such as an RF field. Alternately, microwave energy may be applied to a precursor gas containing any of these elements to generate ions. In one embodiment, ion energy less than 5 keV is utilized for ion implantation. In some embodiments, the gas containing energetic ions may be a plasma. An electrical bias (peak to peak voltage) of between about 5000 V and about 9900 V, such as about 9000V is applied to the substrate support, the gas distributor, or both, to accelerate the ions toward the substrate surface with the desired energy. In some embodiments, the electrical bias is also used to ionize the ion implantation processing gas. In other embodiments, a second electric field is used to ionize the process gas. In one embodiment, a high-frequency RF field and a low-frequency RF field are provided to ionize the ion implantation processing gas and bias the substrate support. The high-frequency field is provided at a frequency of 13.56 MHz and a power level between about 200 W and about 5,000 W, and the low-frequency field is provided at a frequency between about 1,000 Hz and about 10 kHz at a power level between about 50 W and about 200 W. Energetic ions may be generated by an inductively coupled electric field by providing a recirculation pathway through an inductive coil powered by RF power between about 50 W and about 500 W. The ions thus produced will generally be accelerated toward the substrate by biasing the substrate or a gas distributor as described above.

In some embodiments, generations of ions may be pulsed. Power may be applied to the plasma source for a desired time, and then discontinued for a desired time. Power cycling may be repeated for a desired number of cycles at a desired frequency and duty cycle. In many embodiments, the plasma may be pulsed at a frequency between about 0.1 Hz and about 1,000 Hz, such as between about 10 Hz and about 500 Hz. In other embodiments, the plasma pulsing may proceed with a duty cycle (ratio of powered time to unpowered time per cycle) between about 10% and about 90%, such as between about 30% and about 70%.

Figure 3E:
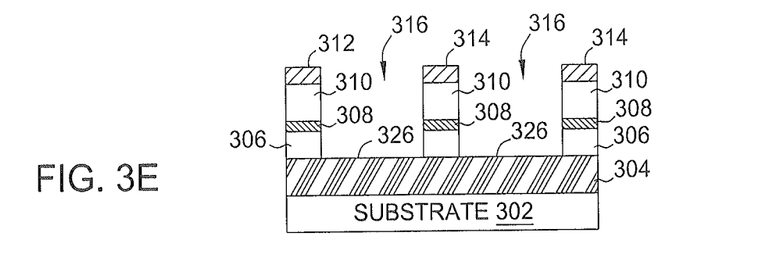

At block 210, after the plasma immersion ion implantation process is completed, the ion implanted first ferromagnetic layer 306, e.g., doped first ferromagnetic layer 306, is then etched by supplying an etching gas mixture into the processing chamber. The etching process is performed to remove the ion implanted first ferromagnetic layer 306, e.g., doped first ferromagnetic layer 306 unmasked by the patterned layers 314, 310, 308 from the substrate, thereby exposing the underlying first electrode 304 disposed on the substrate 302, as shown in FIG. 3E. It is noted that the pretreatment process at block 206, the plasma immersion ion implantation process at block 208 and the etching process at block 210 may be performed in a single processing chamber, such as the processing chamber 100 depicted in FIG. 1. Alternatively, two or more of the processes may be executed in different chambers as needed.

During etching, the etching gas mixture as supplied to etch the doped first ferromagnetic layer 306 may be similar to the etching gas mixture supplied to etch the insulating tunneling layer 308 described above at step 204. In one embodiment, the etching gas mixture may include a hydrocarbon gas and a nitrogen containing gas. It is believed that hydrocarbon gas supplied in the gas mixture may assist reacting with the phosphorous elements formed in the Co and Pt or Pd complex compound, forming a liquid form compound that may be easily evaporated by the heat/thermal energy from the plasma bombardment generated in the processing chamber during processing, thereby forming volatile by-product pumping out of the processing chamber. Furthermore, the nitrogen containing gas may also assist reacting with the Co and Pt or Pd complex compound, thereby assisting removing the first ferromagnetic layer 306 from the substrate 302 with desired profile and critical dimension.

In one embodiment, suitable examples for the hydrocarbon include $CH_4$, $C_2H_4$, $C_3H_8$, $C_2H_6$ and other suitable hydrocarbon compounds. Suitable examples for the nitrogen containing gas includes $NH_3$, $N_2$, $NF_3$, $N_2O$, $NO_2$, NO and the like. Other suitable carrier or reacting gas may also be supplied in the gas mixture. Suitable examples of the carrying or reacting gas include $N_2$, $H_2$, $O_2$, and the like. In another embodiment, an inert gas may also be supplied into the etching gas mixture to assist the profile control as needed. Examples of the inert gas supplied in the gas mixture include Ar, He, Ne, Kr, Xe or the like. In one particular embodiment, the hydrocarbon used in the gas mixture is $CH_4$. The nitrogen containing gas used in the gas mixture is $NH_3$. $N_2$ and $H_2$ gas are also supplied in the gas mixture along with the $CH_4$ and $NH_3$ gas.

In one embodiment, the hydrocarbon compounds and the nitrogen containing gas supplied in the etching gas mixture may be maintained at a predetermined ratio to yield an efficient etching rate while efficiently maintaining desired sidewall profile. In an exemplary embodiment, the hydrocarbon compounds and the nitrogen containing gas is supplied in the etching gas mixture at a ratio between about 5:1 and about 1:0.5, such as about 1:1. Alternatively, $N_2$ gas may be supplied at a flow rate by volume between about 10 sccm and about 20 sccm. The $H_2$ gas may be supplied at a flow rate between about 20 sccm and about 180 sccm, such as about 90 sccm. RF source power is supplied to form a plasma from the gas mixture therein. The RF source power may energize at the gas mixture between about 1000 watts and about 1500 watts, such as about 1200 watts, and at a frequency between about 400 kHz and about 13.56 MHz. A bias power may also be supplied as needed. The bias power may be supplied at between about 400 watts and about 600 watts, such as about 500 watts.

Several process parameters may also be controlled while supplying the etching gas mixture to perform the etching process. The pressure of the processing chamber may be controlled at between about 0.5 milliTorr and about 500 milliTorr, such as between about 1 milliTorr and about 20 milliTorr.

The end point of the etching process at step 210 may be controlled by timed mode or other suitable methods. For example, the etching process may be terminated after performing between about 200 seconds and about 600 seconds until the first electrode 304 is exposed, as shown in FIG. 3E. The etching process may be terminated by determination from an endpoint detector, such as an OES detector or other suitable detector as needed.

Figure 4:
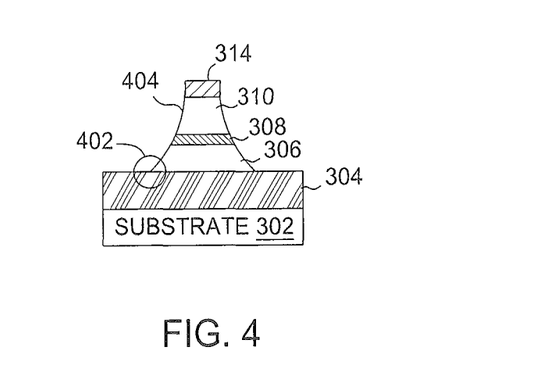
FIG. 4 depicts schematic side view of a magnetic tunnel junction (MTJ) structure formed on a substrate.

It is believed that using oxygen containing pretreatment process at step 206, an ion implantation process to implant ions at block 208, along with an etching process with specific gas mixture at block 210 performed on the first ferromagnetic layer 306, a good profile control and desired critical dimension for the MTJ structure 312 may be obtained. In conventional practice, a slanted, sloped or tapered profile 402 and sidewall 404, as shown in FIG. 4, are always found while forming the MTJ structure 312. Incomplete etching processes or undesired etching byproduct may adhere, redeposit, and stick onto the sidewall of the etched first and second ferromagnetic layer 306, 310 and the insulating tunneling layer 306, resulting in undesired sidewall deformation and sloped profile. By using the new etching gas mixture at block 204 to etch the insulating tunneling layer 306, along with the oxygen containing gas pretreatment process at block 206, the ion implantation process to implant ions at block 208, and the etching process with specific gas mixture at step 210 performed on the first ferromagnetic layer 306 as described by process 200, obtain a substantially more vertical profile of the magnetic tunnel junction MTJ structure 312, as shown in FIG. 3E, thereby improving the electrical properties and device performance.

Accordingly, processes and apparatus of forming MTJ structures for MRAM are provided. The process advantageously provides a method to pre-treat and modify film properties of a ferromagnetic layer by a plasma immersion ion implantation process in a patterned manner along with a specific etching process to fabricate the MTJ structure while maintaining desired profile and critical dimension formed on the substrate.

While the foregoing is directed to embodiments of the invention, other and further embodiments of the invention may be devised without departing from the basic scope thereof.

What is claimed is:

1. A method of forming a magnetic tunnel junction structure on a substrate, comprising:
    placing a substrate having an insulating tunneling layer disposed between a first and a second ferromagnetic layer disposed on the substrate in a processing chamber, wherein the first ferromagnetic layer is disposed on the substrate followed by the insulating tunneling layer and the second ferromagnetic layer sequentially;
    supplying an ion implantation gas mixture into the processing chamber to implant ions into the first ferromagnetic layer exposed by openings defined by the second ferromagnetic layer in the processing chamber; and
    etching the implanted first ferromagnetic layer by an etching gas mixture including hydrocarbon gas and nitrogen containing gas through the openings defined by the second ferromagnetic layer in the same processing chamber, wherein the second ferromagnetic layer serves as an etching mask while etching the first ferromagnetic layer.

2. The method of claim 1, wherein providing the substrate further comprises:
    patterning the insulating tunneling layer by supplying an insulating tunneling layer etching gas mixture to form openings in the insulating tunneling layer.

3. The method of claim 2, wherein the ions are implanted into the first ferromagnetic layer through the openings formed in the insulating tunneling layer.

4. The method of claim 1, wherein providing the substrate further comprises:
    performing a pretreatment process on the first ferromagnetic layer prior to supplying the ion implantation gas mixture.

5. The method of claim 2, wherein the insulating tunneling layer etching gas mixture includes a hydrocarbon gas, and a nitrogen containing gas.

6. The method of claim 5, wherein the hydrocarbon gas includes at least one of $CH_4$, $C_2H_4$, $C_3H_8$, and $C_2H_6$.

7. The method of claim 5, wherein the nitrogen containing gas includes at least one of $NH_3$, $N_2$, $NF_3$, $N_2O$, $NO_2$, and $NO$.

8. The method of claim 5, wherein the hydrocarbon gas is $CH_4$ and the nitrogen containing gas is $NH_3$.

9. The method of claim 5, wherein the etching gas mixture further includes $H_2$.

10. The method of claim 4, wherein the pretreatment process further comprises:
    supplying an oxygen containing gas to pretreat the first ferromagnetic layer.

11. The method of claim 1, wherein the ion implantation gas mixture is selected from a group consisting of $PF_3$, $BH_3$, $B_2H_6$, $P_2H_5$, $PH_3$, $BF_3$, $BCl_3$, $P_2O_5$, and $SF_6$.

12. The method of claim 1, wherein the ion implantation gas mixture includes $PF_3$.

13. The method of claim 1, wherein the etching gas mixture includes at least $CH_4$ and $NH_3$.

14. The method of claim 13, wherein the etching gas mixture further includes $H_2$.

15. The method of claim 1, wherein the substrate further comprises a first electrode disposed between the substrate and the first ferromagnetic layer and a second electrode disposed on top of the second ferromagnetic layer.

16. The method of claim 1, wherein the insulating tunneling layer is selected from a group consisting of $Al_2O_3$, $MgO$, $TaO_x$, and $HfO$.

17. The method of claim 1, wherein the first and the second ferromagnetic layer are selected from a group consisting of Ru containing layer, $NiFeO_x$, NiFe, $CoFeO_x$, CoFeB, CoFe, $NiO_x$, $CoO_x$, $FeO_x$, CoPt, and CoPd.

18. The method of claim 1, wherein the first ferromagnetic layer is CoPt or CoPd.

19. A method of forming a magnetic tunnel junction (MTJ) structure on a substrate, comprising:
    placing a substrate having an insulating tunneling layer disposed between a first and a second ferromagnetic layer disposed on the substrate in a processing chamber, wherein the first ferromagnetic layer is disposed on the substrate followed by the insulating tunneling layer and the second ferromagnetic layer sequentially;
    etching the insulating tunneling layer through openings defined by the second ferromagnetic layer by supplying a first etching gas mixture including at least a hydrocarbon gas and a nitrogen containing gas into the processing chamber to form openings in the insulating tunneling layer;

performing a pretreatment process on the first ferromagnetic layer exposed by the openings defined in the insulating tunneling layer to form a treated region in the first ferromagnetic layer;

supplying an ion implantation gas mixture to implant ions into the treated region in the first ferromagnetic layer; and etching the implanted first ferromagnetic layer through openings defined in the insulating tunneling layer by using a second etching gas mixture including a hydrocarbon gas and a nitrogen containing gas, wherein the etched insulating tunneling layer serves as an etching mask while etching of the implanted first ferromagnetic layer.

20. The method of claim 19, wherein the ions are implanted into the first ferromagnetic layer through the openings formed in the insulating tunneling layer.

21. The method of claim 19, wherein the hydrocarbon gas includes at least one of $CH_4$, $C_2H_4$, $C_3H_8$, and $C_2H_6$.

22. The method of claim 19, wherein the nitrogen containing gas includes at least one of $NH_3$, $N_2$, $NF_3$, $N_2O$, $NO_2$ and NO.

23. The method of claim 19, wherein the hydrocarbon gas is $CH_4$ and the nitrogen containing gas is $NH_3$.

24. The method of claim 19, wherein the etching gas mixture further includes $H_2$.

25. The method of claim 19, wherein the pretreatment process further comprises:

supplying an oxygen containing gas to pretreat the first ferromagnetic layer.

26. The method of claim 19, wherein the ion implantation gas mixture is selected from a group consisting of $PF_3$, $BH_3$, $B_2H_6$, $P_2H_5$, $PH_3$, $BF_3$, $BCl_3$, $P_2O_5$, and $SF_6$.

27. The method of claim 19, wherein the ion implantation gas mixture includes $PF_3$.

28. The method of claim 19, wherein the substrate further comprises a first electrode disposed between the substrate and the first ferromagnetic layer and a second electrode disposed on top of the second ferromagnetic layer.

29. The method of claim 19, wherein the insulating tunneling layer is selected from a group consisting of $Al_2O_3$, MgO, $TaO_x$, and HfO.

30. The method of claim 19, wherein the first and the second ferromagnetic layer are selected from a group consisting of Ru containing layer, $NiFeO_x$, NiFe, $CoFeO_x$, CoFeB, CoFe, $NiO_x$,$CoO_x$, $FeO_x$, CoPt, and CoPd.

31. The method of claim 19, wherein the first ferromagnetic layer is CoPt or CoPd.

32. A method of forming a magnetic tunnel junction structure on a substrate, comprising:

providing a substrate having an insulating tunneling layer disposed between a first and a second ferromagnetic layer disposed on the substrate, wherein the first ferromagnetic layer is disposed on the substrate followed by the insulating tunneling layer and the second ferromagnetic layer sequentially;

performing a pretreatment process on the first ferromagnetic layer exposed by the insulating tunneling layer and the second ferromagnetic layer to form a treated region in the first ferromagnetic layer in a processing chamber;

supplying an ion implantation gas mixture to implant ions into the first ferromagnetic layer exposed by openings defined by the second ferromagnetic layer and the insulating tunneling layer in the same processing chamber; and etching the implanted first ferromagnetic layer by an etching gas mixture including at least a hydrocarbon and a nitrogen containing gas using the patterned second ferromagnetic layer and the insulating tunneling layer as etching mask layers in the same processing chamber, wherein the etching gas mixture including hydrocarbon gas and nitrogen containing gas.

33. The method of claim 32, wherein the ion implantation gas mixture includes $PF_3$.

* * * * *

UNITED STATES PATENT AND TRADEMARK OFFICE
CERTIFICATE OF CORRECTION

| | | |
|---|---|---|
| PATENT NO. | : 9,059,398 B2 | Page 1 of 1 |
| APPLICATION NO. | : 13/750892 | |
| DATED | : June 16, 2015 | |
| INVENTOR(S) | : Kim et al. | |

It is certified that error appears in the above-identified patent and that said Letters Patent is hereby corrected as shown below:

In the specification

Column 8, Line 13, please delete "cornpoemtn, thereby resulinig" and insert -- component, thereby resulting -- therefor;

Column 8, Line 14, please delete "contanimant" and insert -- contaminant -- therefor.

Signed and Sealed this
Fifteenth Day of December, 2015

Michelle K. Lee
*Director of the United States Patent and Trademark Office*